(12) United States Patent
Maeda

(10) Patent No.: US 8,451,148 B2
(45) Date of Patent: May 28, 2013

(54) ENCODING APPARATUS, ENCODING METHOD, DECODING APPARATUS, DECODING METHOD, AND PROGRAM

(75) Inventor: Yuuji Maeda, Tokyo (JP)

(73) Assignee: Sony Corporation, Tokyo (JP)

( * ) Notice: Subject to any disclaimer, the term of this patent is extended or adjusted under 35 U.S.C. 154(b) by 101 days.

(21) Appl. No.: 13/153,915

(22) Filed: Jun. 6, 2011

(65) Prior Publication Data

US 2012/0007753 A1    Jan. 12, 2012

(30) Foreign Application Priority Data

Jul. 12, 2010  (JP) ................. P2010-157539

(51) Int. Cl.
*H03M 7/40*    (2006.01)

(52) U.S. Cl.
USPC .............................................. 341/67; 341/51

(58) Field of Classification Search
USPC .......................... 341/67, 65, 87, 51
See application file for complete search history.

(56) References Cited

U.S. PATENT DOCUMENTS

| | | | | |
|---|---|---|---|---|
| 5,623,557 A | * | 4/1997 | Shimoyoshi et al. | 382/246 |
| 7,864,081 B2 | * | 1/2011 | Inoue et al. | 341/67 |
| 7,894,532 B2 | * | 2/2011 | Otsuka | 375/240.23 |
| 7,965,207 B2 | * | 6/2011 | Hendrickson | 341/67 |
| 8,072,358 B2 | * | 12/2011 | Hagiya et al. | 341/67 |

FOREIGN PATENT DOCUMENTS

| | | |
|---|---|---|
| JP | 3046224 | 3/2000 |
| JP | 3419497 | 4/2003 |

* cited by examiner

*Primary Examiner* — Brian Young
(74) *Attorney, Agent, or Firm* — Finnegan, Henderson, Farabow, Garrett & Dunner LLP

(57) ABSTRACT

Provided is an encoding apparatus including: a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal; a quantizer which quantizes the data signal based on the bit allocation; and an encoder which performs variable length encoding on the quantized data signal, wherein the determination unit updates the second data length so that a difference between a data length of the variable-length-encoded data signal and the first data length is within a predetermined range.

11 Claims, 12 Drawing Sheets

ENCODING APPARATUS, ENCODING METHOD, DECODING APPARATUS, DECODING METHOD, AND PROGRAM

BACKGROUND

The present disclosure relates to an encoding apparatus, an encoding method, a decoding apparatus, a decoding method, and a program and, more particularly, to an encoding apparatus, an encoding method, a decoding apparatus, a decoding method, and a program capable of reducing a remaining area in encoding data in the case where a quantized signal is subject to variable length encoding.

When a spectrum signal of video or audio is quantized in each of quantization units and is subject to variable length encoding, bit allocation is determined in each of the quantization units (for example, refer to Japanese Patent Nos. 3419497 and 3046224). For the determination of the bit allocation, normalization information of the spectrum signal and noise masking information patterned to adjust the bit allocation in accordance with an audible region of the sense of hearing are mainly used.

In the case where the bit allocation is determined by using the normalization information of the spectrum signal and the patterned noise masking information, the control of the bit allocation in accordance with the audible region of the sense of hearing may be implemented.

SUMMARY

However, since the noise masking information is patterned, it is difficult to finely control the bit allocation. As a result, the data length of the spectrum signal in the encoding data is not optimally controlled, so that a large remaining area occurs in the encoding data.

It is desirable to reduce the remaining area in encoding data in the case where a quantized signal is subject to variable length encoding.

According to a first embodiment of the present disclosure, there is provided an encoding apparatus including: a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal; a quantizer which quantizes the data signal based on the bit allocation; and an encoder which performs variable length encoding on the quantized data signal, wherein the determination unit updates the second data length so that a difference between a data length of the variable-length-encoded data signal and the first data length is within a predetermined range.

An encoding method and a program according to the first embodiment of the present disclosure correspond to the encoding apparatus according to the first embodiment of the present disclosure.

In the first embodiment of the present disclosure, the bit allocation at the time of quantizing the data signal is determined based on the normalization information of the data signal so that the data length as the result of the fixed length encoding of the quantized data signal becomes close to the second data length which is equal to or larger than the first data length allocated to the result of the variable length encoding of the quantized data signal; the data signal is quantized based on the bit allocation; the quantized data signal is variable-length-encoded; and the second data length is updated so that the difference between the data length of the variable-length-encoded data signal and the first data length is within in a predetermined range.

According to a second embodiment of the present disclosure, there is provided a decoding apparatus including: an acquisition unit which acquires a quantized variable-length-encoded data signal, a second data length which is equal to or larger than a first data length allocated to the data signal, and normalization information of the data signal; a determination unit which determines bit allocation at the time of quantizing the data signal based on the normalization information of the data signal so that a data length as a result of fixed length encoding of the quantized data signal becomes close to the second data length; a decoder which performs variable length decoding on the quantized variable-length-encoded data signal; and an inverse-quantizer which performs inverse-quantization on the quantized data signal, which is obtained as a result of the variable length decoding by the decoder, based on the bit allocation.

A decoding method and a program according to the second embodiment of the present disclosure correspond to the decoding apparatus according to the second embodiment of the present disclosure.

In the second embodiment of the present disclosure, the quantized variable-length-encoded data signal, the second data length which is equal to or larger than the first data length allocated to the data signal, and the normalization information of the data signal are acquired; the bit allocation at the time of quantizing the data signal is determined based on the normalization information of the data signal so that the data length as the result of the fixed length encoding of the quantized data signal becomes close to the second data length; the quantized variable-length-encoded data signal is variable-length-decoded; and the quantized data signal obtained as the result of the variable length decoding is inverse-quantized based on the bit allocation.

According to the first embodiment of the present disclosure, in the case where the quantized signal is subject to the variable length encoding, it is possible to reduce the remaining area in the encoding data.

In addition, according to the second embodiment of the present disclosure, it is possible to decode the encoding data obtained as a result of the variable length encoding of the quantized signal so that the remaining area in the encoding data is reduced.

DETAILED DESCRIPTION OF EMBODIMENTS

Embodiment

Example of Configuration of Encoding Apparatus According to Embodiment

Figure 1:
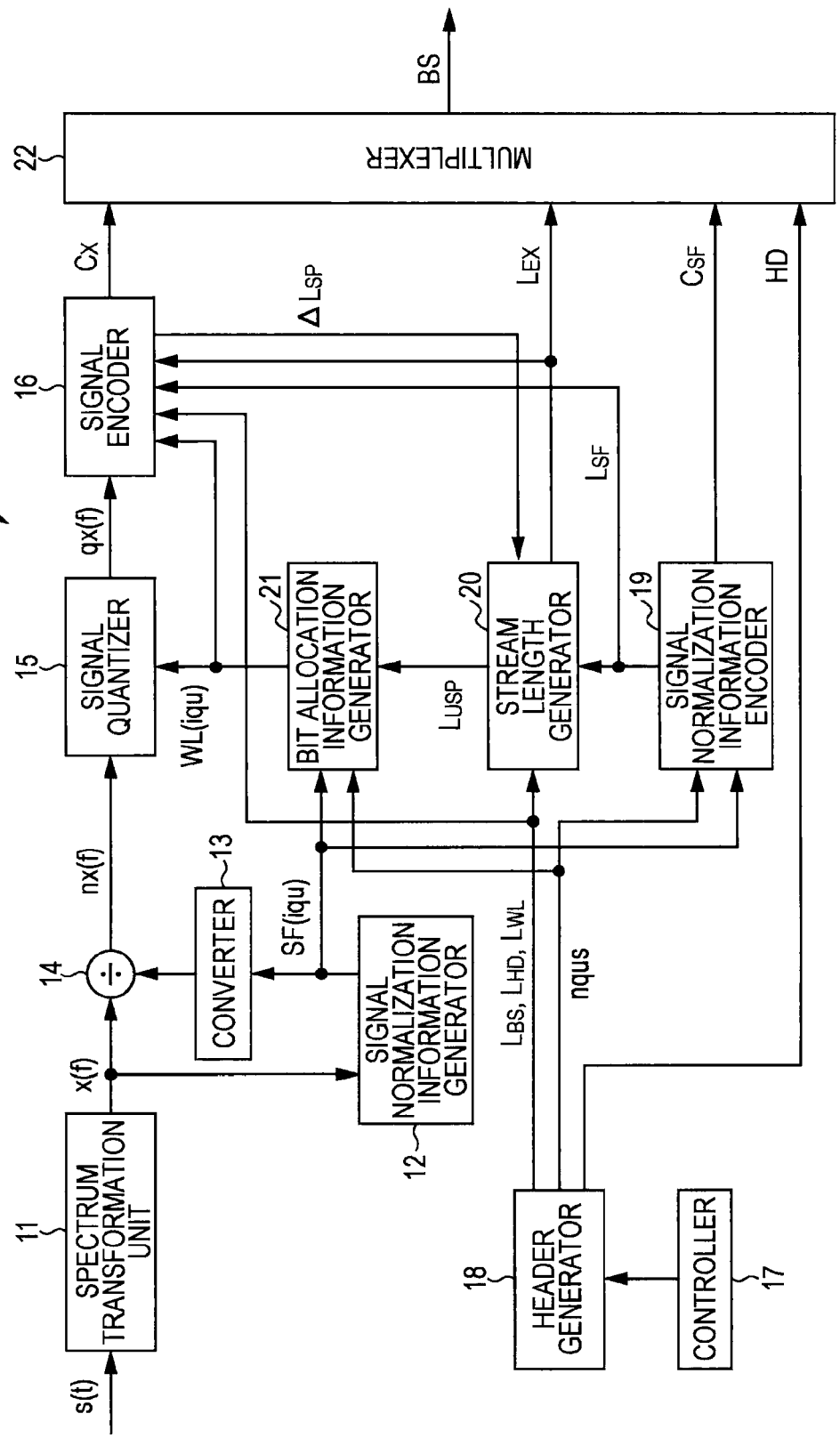
FIG. 1 is a block diagram illustrating an example of a configuration of an encoding apparatus according to an embodiment of the present disclosure.

FIG. 1 is a block diagram illustrating an example of a configuration of an encoding apparatus according to an embodiment of the present disclosure.

In FIG. 1, an encoding apparatus 10 includes a spectrum transformation unit 11, a signal normalization information generator 12, a converter 13, a divider 14, a signal quantizer 15, a signal encoder 16, a controller 17, a header generator 18, a signal normalization information encoder 19, a stream length generator 20, a bit allocation information generator 21, and a multiplexer 22. The encoding apparatus 10 performs quantization and encoding on an input signal s(t), which is a time-varying signal such as sound, and outputs a bitstream BS which is obtained as a result of the quantization and the encoding.

More specifically, the spectrum transformation unit 11 of the encoding apparatus 10 performs frequency transformation on the input signal s(t), which is input from an external portion, to obtain a spectrum signal x(f) which is a frequency domain signal. The spectrum transformation unit 11 divides the spectrum signal x(f) in each of quantization units iqu and supplies the resulting signal to the signal normalization information generator 12 and the divider 14.

The signal normalization information generator 12 obtains the normalization information SF (Scale Factor) (iqu) from the spectrum signal x(f) in each of the quantization units iqu, which is supplied from the spectrum transformation unit 11, by the following Equation (1).

$$2^{SF(iqu)-1} \leq A_{max}(iqu) < 2^{SF(iqu)} \quad (1)$$

In addition, in Equation (1), $A_{max}(iqu)$ denotes the maximum value of the amplitude $A_i$ of the spectrum signal x(f) in each of the quantization units iqu. The normalization information SF(iqu) generated by Equation (1) is applied to the converter 13, the bit allocation information generator 21, and the signal normalization information encoder 19.

The converter 13 converts the normalization information SF(iqu) supplied from the signal normalization information generator 12 into $2^{SF(iqu)}$ and supplies the $2^{SF(iqu)}$ to the divider 14.

The divider 14 divides the spectrum signal x(f) supplied from the spectrum transformation unit 11 by the $2^{SF(iqu)}$ supplied from the converter 13, so that a normalization spectrum signal nx(f) is generated. The divider 14 supplies the normalization spectrum signal nx(f) to the signal quantizer 15.

The signal quantizer 15 (quantizer) quantizes the normalization spectrum signal nx(f) (data signal) supplied from the divider 14 in each of the quantization units iqu based on bit allocation information WL(iqu) in each of the quantization units iqu, which is supplied from the bit allocation information generator 21. In addition, the bit allocation information WL(iqu) is information determining quantization bit sound $B_{i_{qu}}$ of the normalization spectrum signal nx(f) in each of the quantization units iqu. The signal quantizer 15 supplies a quantization signal qx(f), which is obtained as a result of the quantization, to the signal encoder 16.

The signal encoder 16 determines which of a fixed length encoding process and a variable length encoding process is to be performed on the quantization signal qx(f) supplied from the signal quantizer 15 based on an exceeding data length $L_{EX}$ supplied from the stream length generator 20.

In addition, the exceeding data length $L_{EX}$ is a value obtained by subtracting a data length $L_{SP}$' (first data length) of a spectrum domain from an uncompressed spectrum signal data length $L_{USP}$ (second data length) which is a target value of the data size in the case where the quantization signal qx(f) is subject to the fixed length encoding. Herein, as described later, the bitstream BS includes a header HD, an exceeding data length $L_{EX}$, encoding signal normalization information data $C_{SF}$, and encoding spectrum signal data Cx, and the spectrum domain is a domain allocated to the encoding spectrum signal data Cx.

In addition, in the case where the fixed length encoding process is determined to be performed, the signal encoder 16 (encoder) performs the fixed length encoding process on the quantization signal qx(f) and supplies the encoding spectrum signal data Cx, which is obtained as a result of the fixed length encoding process, to the multiplexer 22.

On the other hand, in the case where the variable length encoding process is determined to be performed, the signal encoder 16 performs the variable length encoding based on an occurrence probability on the quantization signal qx(f) based on the bit allocation information WL(iqu) supplied from the bit allocation information generator 21. The signal encoder 16 supplies the encoding spectrum signal data Cx, which are obtained as a result of the variable length encoding, to the multiplexer 22.

In addition, in the case where the variable length encoding process is performed, the signal encoder 16 obtains a difference $\Delta L_{SP}$ based on a data length $L_{SP}$ of the encoding spectrum signal data Cx, a bitstream length $L_{BS}$, a header length $L_{HD}$, and a data length $L_{WL}$ of the exceeding data length $L_{EX}$ supplied from the header generator 18, and data length $L_{SF}$ of the encoding signal normalization information data $C_{SF}$ supplied from the signal normalization information encoder 19 by the following Equation (2).

$$\Delta L_{SP} = L_{BS} - (L_{HD} + L_{WL} + L_{SF} + L_{SP}) \quad (2)$$

Next, the signal encoder 16 supplies the difference $\Delta L_{SP}$ to the stream length generator 20.

The controller 17 receives an input from a user. For example, the controller 17 receives information such as a bit rate input by a user. Next, the controller 17 supplies the information such as a bit rate to the header generator 18.

The header generator 18 determines the bitstream length $L_{BS}$, the header length $L_{HD}$, the data length $L_{WL}$, and an encoding/quantization unit number nqus based on the information such as a bit rate supplied from the controller 17. The header generator 18 supplies the bitstream length $L_{BS}$, the header length $L_{HD}$, and the data length $L_{WL}$ to the signal encoder 16 and the stream length generator 20. In addition, the header generator 18 supplies the encoding/quantization unit number nqus to the signal normalization information encoder 19 and the bit allocation information generator 21. The header generator 18 generates information associated with the encoding such as the bitstream length $L_{BS}$, the header length $L_{HD}$, the data length $L_{WL}$, and the encoding/quantization unit number nqus as the header HD and supplies the header HD to the multiplexer 22.

The signal normalization information encoder 19 encodes the normalization information SF(iqu) supplied from the signal normalization information generator 12. The signal normalization information encoder 19 supplies the encoding signal normalization information data $C_{SF}$, which are obtained as a result of the encoding, to the multiplexer 22. In addition, the signal normalization information encoder 19 supplies the data length $L_{SF}$ of the encoding signal normalization information data $C_{SF}$ corresponding to the encoding/quantization unit number nqus to the signal encoder 16 and the stream length generator 20 based on the encoding/quantization unit number nqus supplied from the header generator 18.

The stream length generator 20 sets the uncompressed spectrum signal data length $L_{USP}$ expressed by the following Equation (3).

$$L_{USP} = \sum_{iqu=0}^{nqus-1} B_{iqu} \cdot W_{iqu} \tag{3}$$

In addition, in Equation (3), $B_{iqu}$ denotes a quantization bit sound of the normalization spectrum signal nx(f) in each of the quantization units iqu, and $W_{iqu}$ denotes the number of spectrums in each of the quantization units iqu.

In addition, the stream length generator 20 (determination unit) updates the uncompressed spectrum signal data length $L_{USP}$ based on the difference $\Delta L_{SP}$ supplied from the signal encoder 16 so that a the difference between the data length $L_{SP}$ of the encoding spectrum signal data Cx and the data length $L_{SP}'$ of the spectrum domain is within a predetermined range. The stream length generator 20 supplies the uncompressed spectrum signal data length $L_{USP}$ to the bit allocation information generator 21.

In addition, the stream length generator 20 calculates the exceeding data length $L_{EX}$ based on the bitstream length $L_{BS}$, the header length $L_{HD}$, and the data length $L_{WL}$ supplied from the header generator 18, the data length $L_{SF}$ supplied from the signal normalization information encoder 19, and the uncompressed spectrum signal data length $L_{USP}$ by the following Equation (4).

$$L_{EX} = L_{USP} - (L_{BS} - (L_{HD} + L_{WL} + L_{SF})) = L_{USP} - L_{SP}' \tag{4}$$

Next, the stream length generator 20 supplies the exceeding data length $L_{EX}$ to the signal encoder 16 and the multiplexer 22.

The bit allocation information generator 21 (determination unit) generates the bit allocation information WL(iqu) based on the normalization information SF(iqu) supplied from the signal normalization information generator 12, the encoding/quantization unit number nqus supplied from the header generator 18, and the uncompressed spectrum signal data length $L_{USP}$ supplied from the stream length generator 20. The bit allocation information generator 21 supplies the bit allocation information WL(iqu) to the signal quantizer 15 and the signal encoder 16.

The multiplexer 22 multiplexes the encoding spectrum signal data Cx supplied from the signal encoder 16, the exceeding data length $L_{EX}$ supplied from the stream length generator 20, the encoding signal normalization information data $C_{SF}$ supplied from the signal normalization information encoder 19, and the header HD supplied from the header generator 18. The multiplexer 22 (output unit) outputs the bitstream BS, which is obtained as a result of the multiplexing, as a result of the encoding.

[Example of Configuration of Bitstream]

Figure 2:
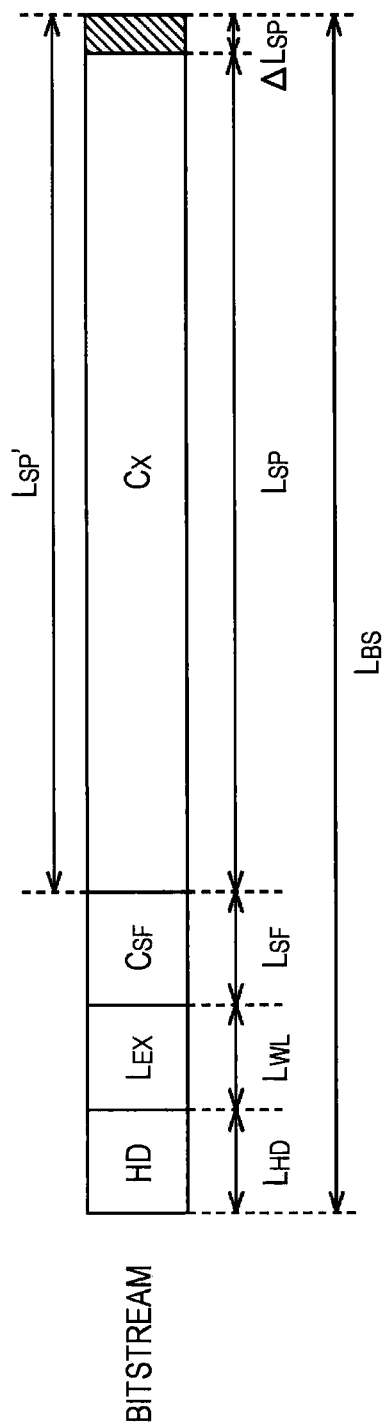
FIG. 2 is a diagram illustrating an example of a configuration of a bitstream.
Figure 3:
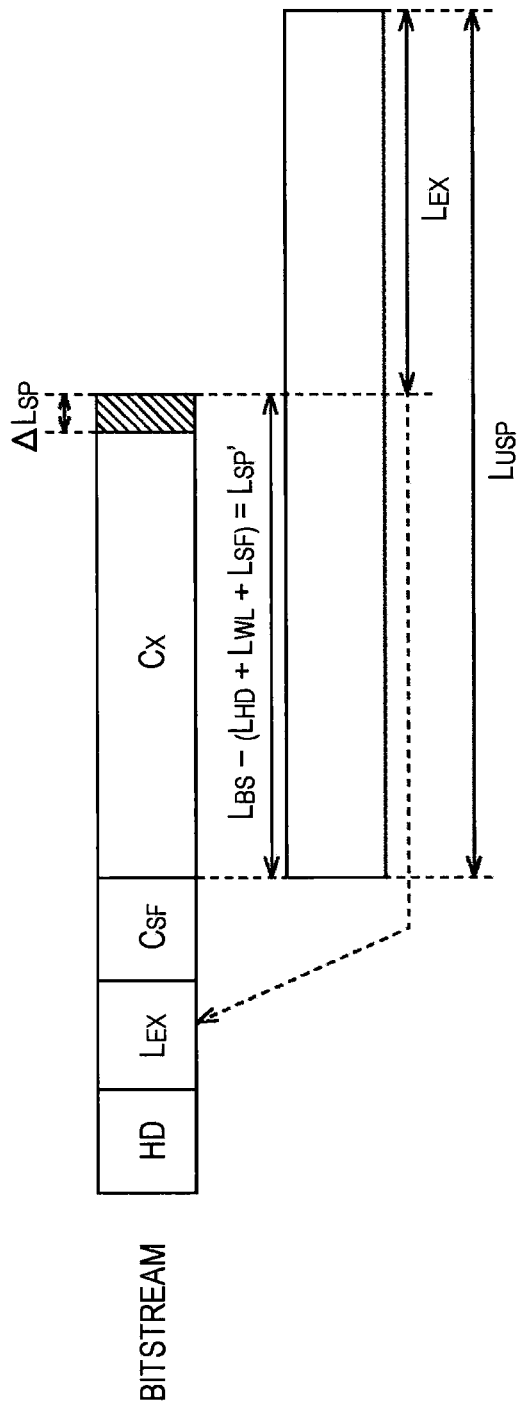
FIG. 3 is a diagram illustrating an example of a configuration of a bitstream.

FIGS. 2 and 3 are diagrams illustrating examples of configurations of the bitstream BS generated by the encoding apparatus 10 illustrated in FIG. 1.

As illustrated in FIGS. 2 and 3, the bitstream BS having the bitstream length $L_{BS}$ includes the header HD having the header length $L_{HD}$, the exceeding data length $L_{EX}$ of the data length $L_{WL}$, the encoding signal normalization information data $C_{SF}$ having the data length $L_{SF}$, and the spectrum domain having the data length $L_{SP}'$. In the spectrum domain having the data length $L_{SP}'$, the encoding spectrum signal data Cx having the data length $L_{SP}$ are disposed, and the remaining area having the difference $\Delta L_{SP}$ is considered to be a remaining area.

Herein, the bitstream length $L_{BS}$ necessarily satisfies the conditions of the following Equation (5).

$$L_{BS} \geq L_{HD} + L_{WL} + L_{SF} + L_{SP} \tag{5}$$

In other words, the data length $L_{SP}$ necessarily satisfies the conditions of the following Equation (6).

$$L_{SP} \leq L_{BS} - (L_{HD} + L_{WL} + L_{SP})(=L_{SP}') \tag{6}$$

[Bit Allocation Information Generating Method]

FIGS. 4 to 11 are diagrams illustrating a method of generating the bit allocation information WL(iqu).

Figure 4:
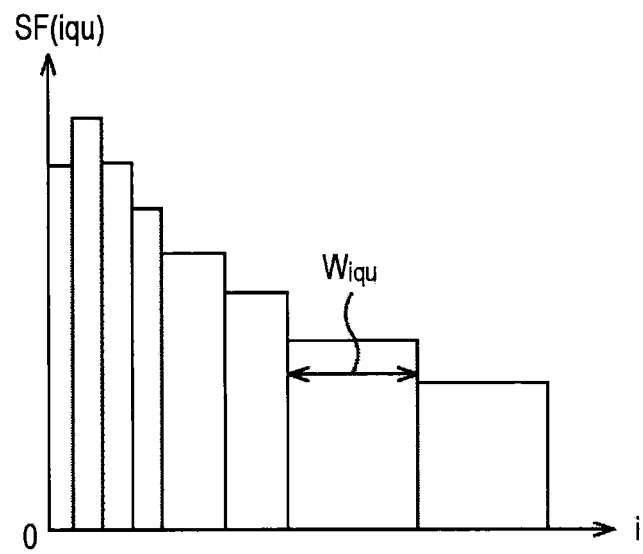
FIG. 4 is a diagram illustrating an example of normalization information.

Herein, the case of generating the bit allocation information WL(iqu) corresponding to the normalization information SF(iqu) illustrated in FIG. 4 is described.

In addition, in FIG. 4, the horizontal axis represents the frequency i, and the vertical axis represents the normalization information SF(iqu). In addition, the horizontal length of each bar in the graph of FIG. 4 corresponds to the number $W_{iqu}$ of spectrums in each of the quantization units iqu.

Figure 5:
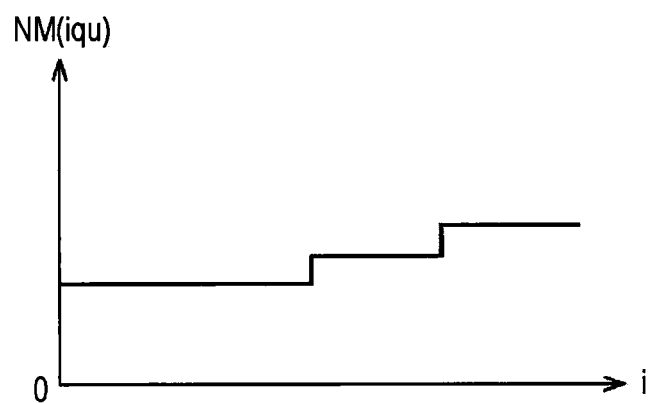
FIG. 5 is a diagram illustrating an example of a noise masking curve.

In addition, FIG. 5 is a diagram illustrating an example of the noise masking curve NM(iqu) applied to the normalization information SF(iqu) of each of the quantization units iqu. In FIG. 5, the horizontal axis represents the frequency i, and the vertical axis represents the noise masking curve NM(iqu). The level of the noise masking curve NM(iqu) illustrated in FIG. 5 is increased in the high frequency domain.

In the case where the bit allocation information WL(iqu) corresponding to the normalization information SF(iqu) illustrated in FIG. 4 is generated, first, the noise masking curve NM(iqu) illustrated in FIG. 5 is subtracted from the normalization information SF(iqu) illustrated in FIG. 4.

Figure 6:
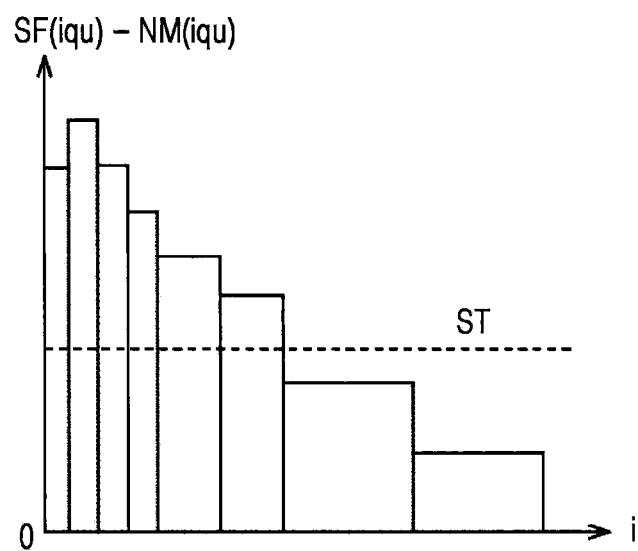
FIG. 6 is a diagram illustrating a value obtained by subtracting a noise masking curve from normalization information.

FIG. 6 is a diagram illustrating the subtraction value obtained as a result thereof. In addition, in FIG. 6, the horizontal axis represents the frequency i, and the vertical axis represents the subtraction value obtained by subtracting the noise masking curve NM(iqu) of FIG. 5 from the normalization information SF(iqu) of FIG. 4.

As described above, since the level of the noise masking curve NM(iqu) illustrated in FIG. 5 is increased in the high frequency domain, as illustrated in FIG. 6, the subtraction value obtained by subtracting the noise masking curve NM(iqu) illustrated in FIG. 5 from the normalization information SF(iqu) illustrated in FIG. 4 is decreased by the high frequency domain.

Next, the bit allocation information WL(iqu) is generated based on the subtraction value illustrated in FIG. 6 by the following Equation (7).

$$WL(iqu) = \max(SF(iqu) - NM(iqu) - ST, \text{Low}) \tag{7}$$

In addition, in Equation (7), max(a,b) denotes a function of selecting the larger one of arguments a and b. In addition, ST denotes a reference value, and Low denotes the minimum value of the bit allocation information WL(iqu) in each of the quantization units iqu. Details of the reference value ST will be described later.

Figure 7:
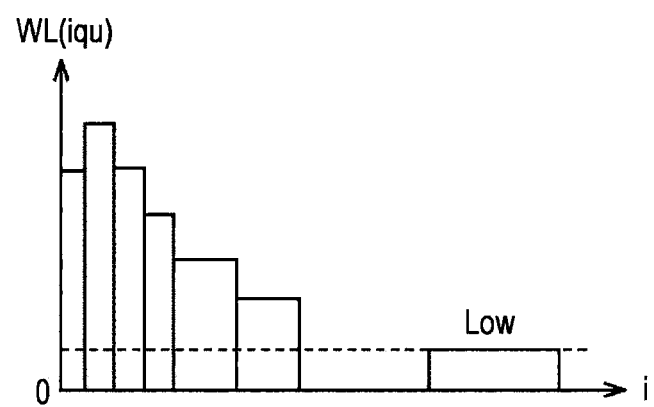
FIG. 7 is a diagram illustrating bit allocation information.

FIG. 7 is a diagram illustrating the bit allocation information WL(iqu) generated based on the subtraction value illustrated in FIG. 6. In addition, in FIG. 7, the horizontal axis represents the frequency i, and the vertical axis represents the bit allocation information WL(iqu).

Next, the quantization bit sound $B_{iqu}$ is determined based on the bit allocation information WL(iqu) illustrated in FIG. 7 by the following Equation (8).

$$B_{iqu} = \begin{cases} 0, & WL(iqu) = 0 \\ WL(iqu) + 1, & WL(iqu) > 0 \end{cases} \quad (8)$$

In this manner, the bit allocation information WL(iqu) is generated so that the subtraction value obtained by subtracting the noise masking curve NM(iqu) from the normalization information SF(iqu) is increased as much as possible, and the quantization bit sound $B_{iqu}$ are determined so that the bit allocation information WL(iqu) is increased as much as possible. Therefore, as illustrated in FIG. 5, in the noise masking curve NM(iqu), the level in the high frequency domain is increased, so that the bits may be mainly distributed in the low frequency domain which is important in terms of the sense of hearing.

Next, the method of determining the reference value ST is described with reference to FIGS. 8 to 11.

Figure 8:
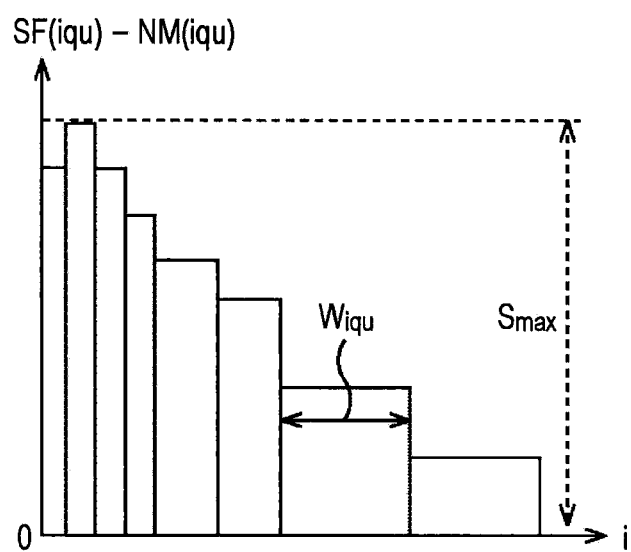
FIG. 8 is a diagram illustrating a value obtained by subtracting a noise masking curve from normalization information.

FIG. 8 is a diagram illustrating the subtraction value, that is, the value obtained by subtracting the noise masking curve NM(iqu) of FIG. 5 from the normalization information SF(iqu) of FIG. 4 similarly to FIG. 6.

In the case of determining the reference value ST, first, as illustrated in FIG. 8, the maximum value, which is the subtraction value obtained by subtracting the noise masking curve NM(iqu) illustrated in FIG. 5 from the normalization information SF(iqu) illustrated in FIG. 4, is set to $S_{max}$, and as expressed in the following Equation (9), the difference D(iqu) between the maximum value $S_{max}$ and the subtraction value is calculated.

$$D(iqu) = S_{max} - (SF(iqu) - NM(iqu)) \quad (9)$$

Figure 9:
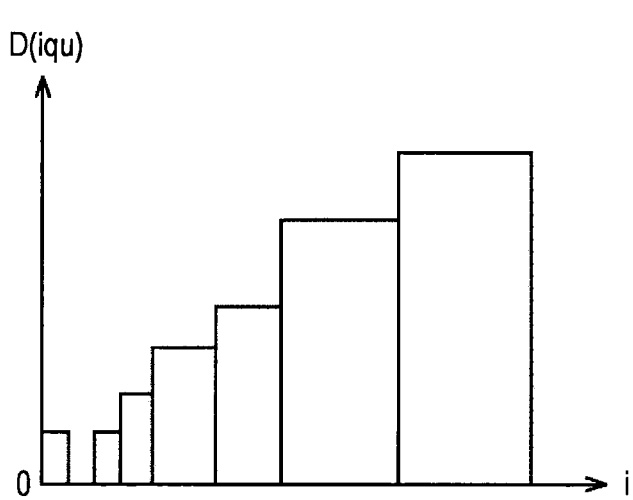
FIG. 9 is a diagram illustrating a difference.

FIG. 9 is a diagram illustrating the difference D(iqu) obtained by Equation (9). In addition, in FIG. 9, the horizontal axis represents the frequency i, and the vertical axis represents the difference D(iqu). The difference D(iqu) takes an integer value such as 0, 1, 2, . . . .

Next, as expressed in the following Equation (10), the total sum AW[D(iqu)] of the number $W_{iqu}$ of spectrums in each of the quantization units iqu is calculated for each difference D(iqu).

$$AW[D(iqu)] = \sum_{iqu} W_{iqu} \text{ for } Eqn. \quad (10)$$

Figure 10:
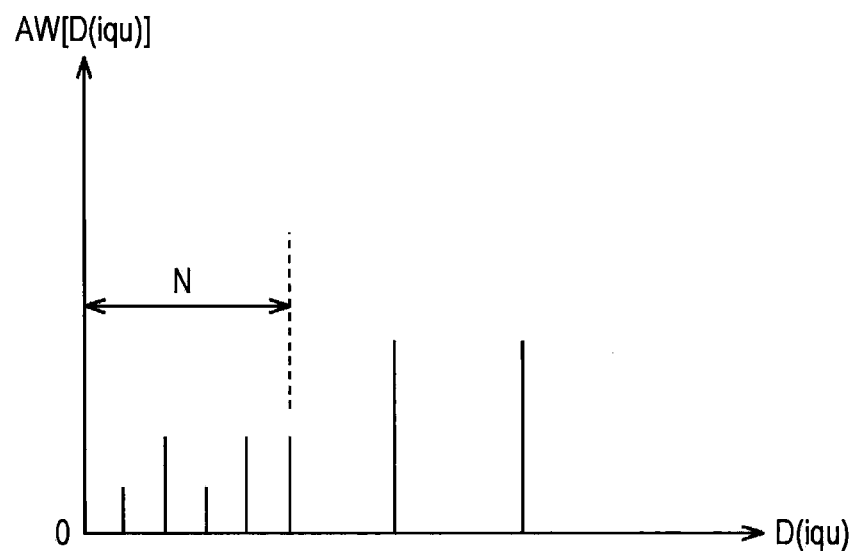
FIG. 10 is a diagram illustrating a total sum.

FIG. 10 is a diagram illustrating the total sum AW[D(iqu)] obtained by Equation (10). In addition, in FIG. 10, the horizontal axis represents the difference D(iqu), and the vertical axis represents the total sum AW[D(iqu)].

Next, as expressed in the following Equation (11), the total sum AW[D(iqu)] is added by using auxiliary added terms $S_N$ and $T_N$.

$$S_0 = AW[0], T_1 = S_0$$

$$S_1 = S_0 + AW[1], T_2 = T_1 + S_1$$

. . .

$$S_{N-1} = S_{N-2} + AW[N-1], T_N = T_{N-1} + S_{N-1} \quad (11)$$

Figure 11:
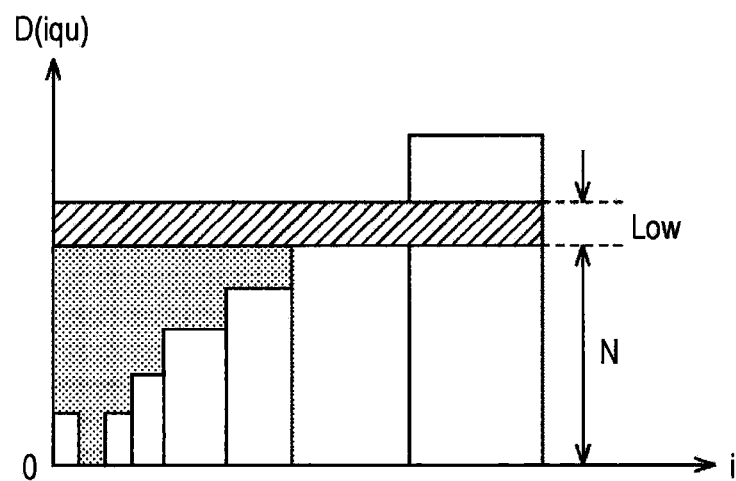
FIG. 11 is a diagram illustrating an auxiliary added term.

In Equation (11), the auxiliary added term $T_N$ corresponds to the area of the entirely shaded portion in FIG. 11. In addition, in FIG. 11, the horizontal axis represents the frequency i, and the vertical axis represents the difference D(iqu).

In addition, the sum of the area of the entirely-shaded portion in FIG. 11 and the area of the obliquely-hatched portion in FIG. 11, that is, the sum of the auxiliary added term $T_N$ and the product between the minimum value Low and the sum of the spectrum numbers $W_{iqu}$ in the quantization units iqu becomes the total number of the quantization bit sounds $B_{iqu}$ excluding the bit numbers of the positive and negative bits of the case where the reference value ST is $S_{max}-(N+$Low).

Therefore, the N of the case where the auxiliary added term $T_N$ becomes the maximum value satisfying the conditions expressed by the following Equation (12) is obtained.

$$T_N \leq L_{usp} - S_{N-1}, \text{Low} = 0$$

$$T_N \leq L_{usp} - (\text{Low}+1) \times nsp, \text{Low} > 0 \quad (12)$$

In addition, in Equation (12), nsp denotes the total number of spectrums as the object of the encoding. In addition, in Equation (12), the subtraction of $S_{N-1}$ from the uncompressed spectrum signal data length $L_{USP}$ denotes the subtraction of the bit number of the positive and negative bits from the uncompressed spectrum signal data length $L_{USP}$.

In this manner, the obtained N is the maximum value of N such that the total number of the quantization bit sounds $B_{iqu}$ is equal to or smaller than the uncompressed spectrum signal data length $L_{USP}$. Next, the reference value ST is calculated by using the N in accordance with the following Equation (13).

$$ST = S_{max} - (N + \text{Low}) \quad (13)$$

In this manner, the bit allocation information WL(iqu) is calculated by using the reference value ST. Therefore, the bit allocation information WL(iqu) is quantized based on the bit allocation information WL(iqu) and set so that the data length of the fixed-length-encoded normalization spectrum signal nx(f) is closest to the uncompressed spectrum signal data length $L_{USP}$.

In addition, the difference δ between the auxiliary added term $T_N$ and the uncompressed spectrum signal data length $L_{USP}$ is defined by the following Equation (14).

$$\delta = L_{usp}' - T_N$$

$$L_{usp}' = L_{usp} - S_{N-1}, \text{Low} = 0$$

$$L_{usp}' = L_{usp} - (\text{Low}+1) \times nsp, \text{Low} > 0 \quad (14)$$

In the case where the difference δ has a positive value, in the encoding apparatus 10, bits are re-distributed bit by bit from the quantization unit iqu, which is important in terms of the sense of hearing, based on the difference 6 within a range where the conditions expressed by the following Equation (15) are satisfied. In other words, the bit allocation information WL(iqu) in the quantization unit iqu, which is important in terms of the sense of hearing, is increased.

$$\delta \geq \sum_{iqu} 1 \cdot W_{iqu} \quad (15)$$

Figure 12:
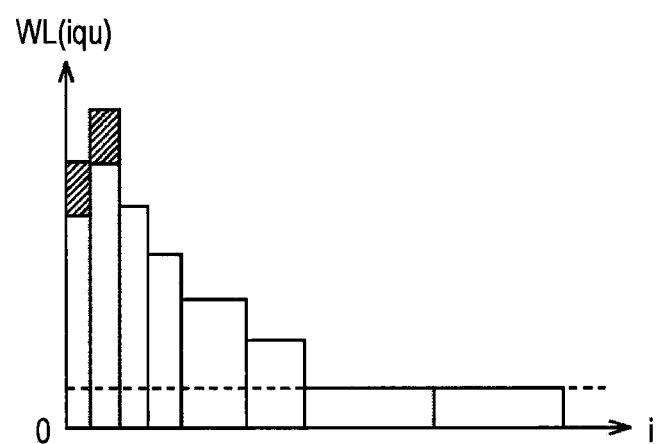
FIG. 12 is a diagram illustrating re-distributed bit allocation information.

FIG. 12 is a diagram illustrating the bit allocation information WL(iqu) which is obtained as a result of the re-distribution of the bit allocation information WL(iqu) illustrated in FIG. 7.

In addition, in FIG. 12, the horizontal axis represents the frequency i, and the vertical axis represents the bit allocation information WL(iqu). In addition, the obliquely-hatched portion in FIG. 12 corresponds to the re-distributed bits.

In the example of FIG. 12, the quantization unit iqu which is important in terms of the sense of hearing is considered to be a lower frequency quantization unit iqu, and thus, the bits are re-distributed to the lowest-frequency quantization unit iqu and the second lowest-frequency quantization unit iqu.

[Description of Processes of Encoding Apparatus]

Figure 13:
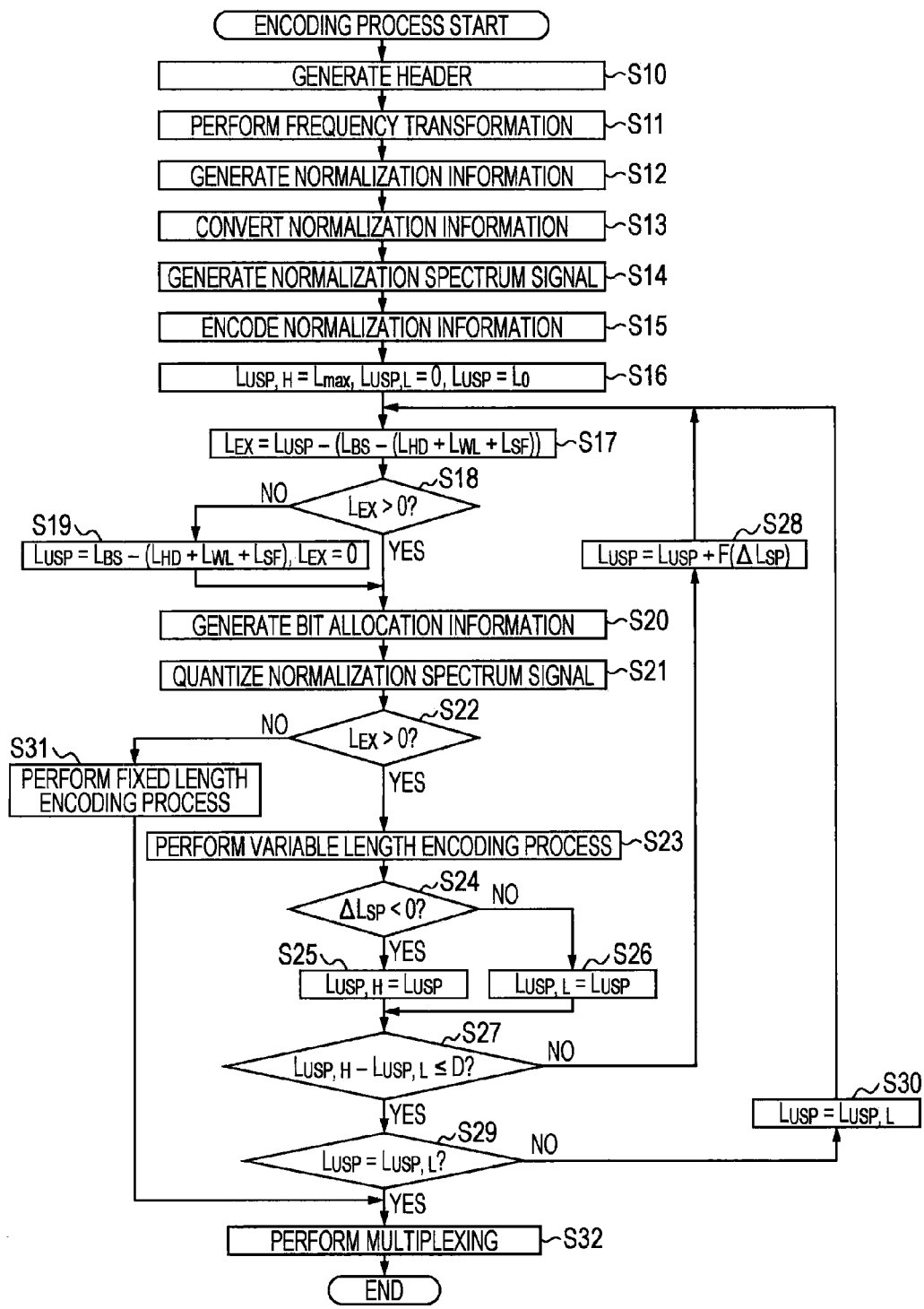
FIG. 13 is a flowchart illustrating an encoding process.

FIG. 13 is a flowchart illustrating the encoding process performed by the encoding apparatus 10 illustrated in FIG. 1. The encoding process starts, for example, when an input signal s(t) is input to the encoding apparatus 10.

In Step S10, the header generator 18 generates the header HD based on the information such as a bit rate supplied from the controller 17. More specifically, the header generator 18 determines the bitstream length $L_{BS}$, the header length $L_{HD}$, the data length $L_{WL}$, and the encoding/quantization unit number nqus based on the information such as a bit rate supplied from the controller 17. Next, the header generator 18 generates the information associated with the encoding such as the bitstream length $L_{BS}$, the header length $L_{HD}$, the data length $L_{WL}$, and the encoding/quantization unit number nqus as the header HD having the header length $L_{HD}$.

The header generator 18 supplies the bitstream length $L_{BS}$, the header length $L_{HD}$, and the data length $L_{WL}$, to the signal encoder 16 and the stream length generator 20. In addition, the header generator 18 supplies the encoding/quantization unit number nqus to the signal normalization information encoder 19 and the bit allocation information generator 21. In addition, the header generator 18 supplies the header HD to the multiplexer 22.

In Step S11, the spectrum transformation unit 11 performs frequency transformation on the input signal s(t) to obtain a spectrum signal x(f) which is a frequency domain signal. The spectrum transformation unit 11 divides the spectrum signal x(f) in each of the quantization units iqu and supplies the resulting signal to the signal normalization information generator 12 and the divider 14.

In Step S12, the signal normalization information generator 12 generates normalization information SF(iqu) from the spectrum signal x(f) in each of the quantization units iqu, which is supplied from the spectrum transformation unit 11, by the aforementioned Equation (1). Next, the signal normalization information generator 12 supplies the normalization information SF(iqu) to the converter 13, the bit allocation information generator 21, and the signal normalization information encoder 19.

In Step S13, the converter 13 converts the normalization information SF(iqu) supplied from the signal normalization information generator 12 into $2^{SF(iqu)}$ and supplies the $2^{SF(iqu)}$ to the divider 14.

In Step S14, the divider 14 divides the spectrum signal x(f) supplied from the spectrum transformation unit 11 by the $2^{SF(iqu)}$ supplied from the converter 13, so that a normalization spectrum signal nx(f) is generated.

In Step S15, the signal normalization information encoder 19 encodes the normalization information SF(iqu) supplied from the signal normalization information generator 12. The signal normalization information encoder 19 supplies the encoding signal normalization information data $C_{SF}$, which are obtained as a result of the encoding, to the multiplexer 22. In addition, the signal normalization information encoder 19 supplies the data length $L_{SF}$ of the encoding signal normalization information data $C_{SF}$ corresponding to the encoding/quantization unit number nqus to the signal encoder 16 and the stream length generator 20 based on the encoding/quantization unit number nqus supplied from the header generator 18.

In Step S16, the stream length generator 20 sets the highest value $L_{USP,H}$ of the uncompressed spectrum signal data length $L_{USP}$ to a predetermined value $L_{max}$ corresponding to the bit rate and sets the lowest value $L_{USP,L}$ to 0. In addition, the stream length generator 20 sets the uncompressed spectrum signal data length $L_{USP}$ to the initial value $L_0$. In addition, as the initial value $L_0$, a sufficiently large value, for example, a bitstream length $L_{BS}$ is used.

In Step S17, the stream length generator 20 calculates the exceeding data length $L_{EX}$ based on the bitstream length $L_{BS}$, the header length $L_{HD}$, and the data length $L_{WL}$ supplied from the header generator 18, the data length $L_{SF}$ supplied from the signal normalization information encoder 19, and the uncompressed spectrum signal data length $L_{USP}$ by the aforementioned Equation (4).

In Step S18, the stream length generator 20 determines whether or not the exceeding data length $L_{EX}$ is larger than 0. In the case where it is determined in Step S18 that the exceeding data length $L_{EX}$ is not larger than 0, in Step S19, the stream length generator 20 sets the uncompressed spectrum signal data length $L_{USP}$ to $L_{BS}-(L_{HD}+L+L_{SF})$ and supplies the uncompressed spectrum signal data length $L_{USP}$ to the bit allocation information generator 21. In addition, the stream length generator 20 sets the exceeding data length $L_{EX}$ to 0 and supplies the exceeding data length $L_{EX}$ to the signal encoder 16 and the multiplexer 22. Next, the process proceeds to Step S20.

On the other hand, in the case where it is determined in Step S18 that the exceeding data length $L_{EX}$ is larger than 0, the stream length generator 20 supplies the set uncompressed spectrum signal data length $L_{USP}$ to the bit allocation information generator 21 and supplies the exceeding data length $L_{EX}$ calculated in Step S17 to the multiplexer 22. Next, the process proceeds to Step S20.

In Step S20, the bit allocation information generator 21 generates the bit allocation information WL(iqu) based on the normalization information SF(iqu) supplied from the signal normalization information generator 12, the encoding/quantization unit number nqus supplied from the header generator 18, the uncompressed spectrum signal data length $L_{USP}$ supplied from the stream length generator 20, and the like.

More specifically, the bit allocation information generator 21 obtains a difference D(iqu) by the aforementioned Equation (9) and obtains a total sum AW[D(iqu)] by the aforementioned Equation (10) based on the noise masking curve NM(iqu), the normalization information SF(iqu), and the encoding/quantization unit number nqus. Next, the bit allocation information generator 21 obtains the N of the case where the auxiliary added term $T_N$ obtained by using the total sum AW[D(iqu)] according to the aforementioned Equation (11) becomes the maximum value satisfying the conditions expressed by the aforementioned Equation (12) using the uncompressed spectrum signal data length $L_{USP}$. Next, the bit allocation information generator 21 obtains the reference value ST by using N according to the aforementioned Equation (13). The bit allocation information generator 21 generates the bit allocation information WL(iqu) by using the obtained reference value ST, the normalization information SF(iqu), and the noise masking curve NM(iqu) according to the aforementioned Equation (7).

In addition, the bit allocation information generator 21 calculates the difference 6 by using the aforementioned Equation (14) based on the auxiliary added term $T_N$ and the uncompressed spectrum signal data length $L_{USP}$. Next, the bit allocation information generator 21 re-distributes bits from the quantization unit iqu, which is important in terms of the sense of hearing, bit by bit within a range where the conditions expressed by the aforementioned Equation (15) are satisfied, so that the bit allocation information WL(iqu) generated by Equation (7) is updated. Next, the bit allocation information generator 21 supplies the updated bit allocation information WL(iqu) to the signal quantizer 15 and the signal encoder 16.

In Step S21, the signal quantizer 15 quantizes the normalization spectrum signal nx(f) supplied from the divider 14 in each of the quantization units iqu based on the bit allocation information WL(iqu) in each of the quantization units iqu supplied from the bit allocation information generator 21. More specifically, the signal quantizer 15 obtains the quantization bit sound $B_{iqu}$ from the bit allocation information WL(iqu) by using the aforementioned Equation (8) and quantizes the normalization spectrum signal nx(f) based on the quantization bit sound $B_{iqu}$. The signal quantizer 15 supplies the quantization signal qx(f), which is obtained as a result of the quantization, to the signal encoder 16.

In Step S22, the signal encoder 16 determines whether or not the exceeding data length $L_{EX}$ supplied from the stream length generator 20 is larger than 0. In the case where the exceeding data length $L_{EX}$ is determined to be larger than 0 in Step S22, the process proceeds to Step S23.

In Step S23, the signal encoder 16 performs the variable length encoding process based on the occurrence probability on the quantization signal qx(f) supplied from the signal quantizer 15 based on the bit allocation information WL(iqu) supplied from the bit allocation information generator 21. The signal encoder 16 supplies the encoding spectrum signal data Cx, which are obtained as a result of the variable length encoding process, to the multiplexer 22.

In addition, the signal encoder 16 calculates the difference $\Delta L_{SP}$ based on the data length $L_{SP}$ of the encoding spectrum signal data Cx, the bitstream length $L_{BS}$, the header length $L_{HD}$, and the data length $L_{WL}$, supplied from the header generator 18, and the data length $L_{SF}$ supplied from the signal normalization information encoder 19 by the aforementioned Equation (2). Next, the signal encoder 16 supplies the difference $\Delta L_{SP}$ to the stream length generator 20.

In Step S24, the stream length generator 20 determines whether or not the difference $\Delta L_{SP}$ supplied from the signal encoder 16 is smaller than 0. In the case where the difference $\Delta L_{SP}$ is determined to be smaller than 0 in Step S24, in other words, in the case where the encoding spectrum signal data Cx are not included in the spectrum domain having the data length $L_{SP}'$, the process proceeds to Step S25.

In Step S25, the stream length generator 20 sets the highest value $L_{USP,H}$ of the uncompressed spectrum signal data length $L_{USP}$ to the currently-set uncompressed spectrum signal data length $L_{USP}$. Next, the process proceeds to Step S27.

On the other hand, in the case where the difference $\Delta L_{SP}$ is determined not to be smaller than 0 in Step S24, in other words, in the case where the encoding spectrum signal data Cx are included in the spectrum domain having the data length $L_{SP}'$, the process proceeds to Step S26.

In Step S26, the stream length generator 20 sets the lowest value $L_{USP,L}$ of the uncompressed spectrum signal data length $L_{USP}$ to the currently-set uncompressed spectrum signal data length $L_{USP}$. Next, the process proceeds to Step S27.

In Step S27, the stream length generator 20 determines whether or not the value obtained by subtracting the lowest value $L_{USP,L}$ from the highest value $L_{USP,H}$ of the uncompressed spectrum signal data length $L_{USP}$ is equal to or smaller than a predetermined threshold value D.

In the case where the value obtained by subtracting the lowest value $L_{USP,L}$ from the highest value $L_{USP,H}$ is determined not to be equal to or smaller than the predetermined threshold value D in Step S27, the process proceeds to Step S28. In Step S28, the stream length generator 20 increments the uncompressed spectrum signal data length $L_{USP}$ by a value $F(\Delta L_{SP})$ of a predetermined function F based on the difference $\Delta L_{SP}$.

As the predetermined function F, a function of which the value $F(\Delta L_{SP})$ is negative when the difference $\Delta L_{SP}$ has a negative value and of which the value $F(\Delta L_{SP})$ is positive when the difference $\Delta L_{SP}$ has a positive value is used. According to the predetermined function F, in the case where the encoding spectrum signal data Cx are not included in the spectrum domain of the data length $L_{SP}'$, the uncompressed spectrum signal data length $L_{USP}$ is decreased, and in the case where the encoding spectrum signal data Cx are included in the spectrum domain of the data length $L_{SP}'$, the uncompressed spectrum signal data length $L_{USP}$ is increased.

As the predetermined function F, for example, the following Equation (16) may be used.

$$F(\Delta L_{sp}) = int(\alpha \times \Delta L_{sp}) \tag{16}$$

In addition, in Equation (16), int( ) is a function of obtaining an integer value of the value included in ( ), and a denotes the number of the fixed length encoding bits corresponding to 1 bit compressed by the variable length encoding.

According to Equation (16), it is possible to change the uncompressed spectrum signal data length $L_{USP}$ which is influenced by the variable length encoding.

After the process of Step S28, the process returns to Step S17, and the processes of Steps S17, S18, and S20 to S27 are repeated until the exceeding data length $L_{EX}$ is equal to or smaller than 0 or until the value obtained by subtracting the lowest value $L_{USP,L}$ from the highest value $L_{USP,H}$ is equal to or smaller than the predetermined threshold value D.

Therefore, the uncompressed spectrum signal data length $L_{USP}$ is gradually decreased from the initial value $L_0$ until the difference $\Delta L_{SP}$ is equal to or larger than 0, so that the highest value $L_{USP,H}$ is gradually decreased. Next, in the case where the difference $\Delta L_{SP}$ is equal to or larger than 0 and the exceeding data length $L_{EX}$ is not equal to or smaller than 0, the uncompressed spectrum signal data length $L_{USP}$ is gradually increased, so that the lowest value $L_{USP,L}$ is within the threshold value D from the highest value $L_{USP,H}$.

In the case where the value obtained by subtracting the lowest value $L_{USP,L}$ from the highest value $L_{USP,H}$ is determined to be equal to or smaller than the predetermined threshold value D in Step S27, in Step S29, the stream length generator 20 determines whether or not the uncompressed spectrum signal data length $L_{USP}$ is set to the lowest value $L_{USP,L}$.

In the case where the uncompressed spectrum signal data length $L_{USP}$ is determined not to be set to the lowest value $L_{USP,L}$ in Step S29, in Step S30, the stream length generator 20 sets the uncompressed spectrum signal data length $L_{USP}$ to the lowest value $L_{USP,L}$, and the process returns to Step S17.

On the other hand, in the case where the uncompressed spectrum signal data length $L_{USP}$ is determined to be set to the lowest value $L_{USP,L}$ in Step S29, the process proceeds to Step S32.

In this manner, the uncompressed spectrum signal data length $L_{USP}$ is set to the lowest value $L_{USP,L}$ within the threshold value D from the highest value $L_{USP,H}$, which is the value of the uncompressed spectrum signal data length $L_{USP}$ just before the difference $\Delta L_{SP}$ is equal to or larger than 0. As a result, the difference $\Delta L_{SP}$ is within the predetermined range corresponding to the threshold value D.

In addition, in the case where the exceeding data length $L_{EX}$ is determined not to be larger than 0 in Step S22, in Step S31, the signal encoder 16 performs the fixed length encoding on the quantization signal qx(f). Next, the signal encoder 16 supplies the encoding spectrum signal data Cx, which are obtained as a result of the fixed length encoding, to the multiplexer 22, and the process proceeds to Step S32.

In Step S32, the multiplexer 22 multiplexes the encoding spectrum signal data Cx supplied from the signal encoder 16, the exceeding data length $L_{EX}$ supplied from the stream length generator 20, the encoding signal normalization information data $C_{SF}$ supplied from the signal normalization information encoder 19, and the header HD supplied from the header generator 18. Next, the multiplexer 22 outputs the bitstream BS, which is obtained as a result of the multiplexing, as a result of the encoding, and the process is ended.

In this manner, in the encoding apparatus 10, the uncompressed spectrum signal data length $L_{USP}$ is set so that the difference $\Delta L_{SP}$ is within the predetermined range corresponding to the threshold value D, and the bit allocation information WL(iqu) is generated so that the data length of the normalization spectrum signal nx(f), which is subject to the fixed length encoding, is closest to the uncompressed spectrum signal data length $L_{USP}$. Therefore, it is possible to reduce the remaining area in the bitstream BS. In other words, it is possible to efficiently allocate the spectrum domain to the encoding spectrum signal data Cx.

In addition, the encoding apparatus 10 does not output the parameter (for example, noise masking information) for generating the bit allocation information WL(iqu) as the quantization information, but it outputs the exceeding data length $L_{EX}$ as the quantization information. Therefore, it is possible to reduce the area of the quantization information in the bitstream BS. As a result, it is possible to increase the data length $L_{SP}'$ of the spectrum domain.

[Example of Configuration of Decoding Apparatus]

Figure 14:
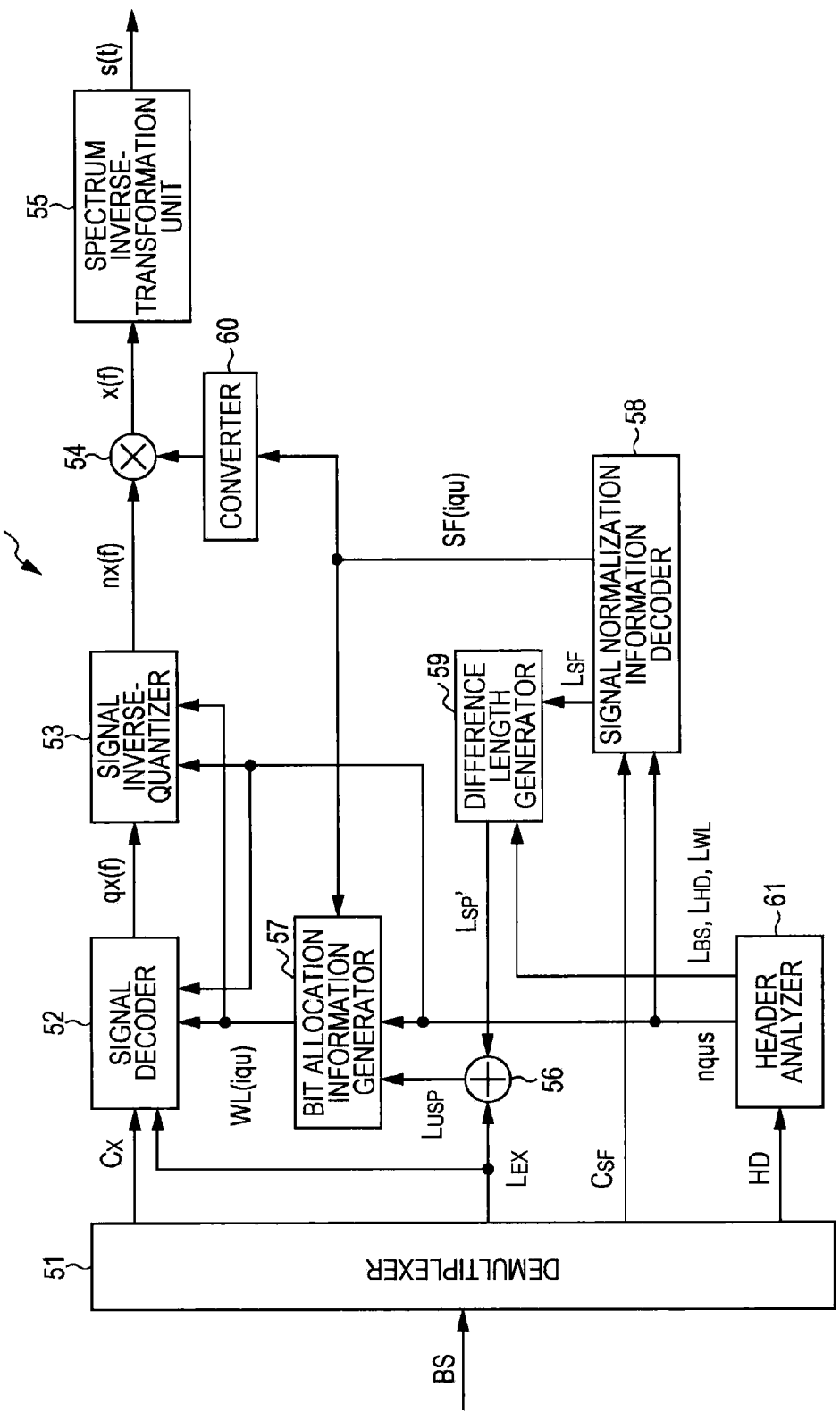
FIG. 14 is a block diagram illustrating an example of a configuration of a decoding apparatus.

FIG. 14 is a block diagram illustrating an example of a configuration of a decoding apparatus which decodes the bitstream BS which is a result of the encoding performed by the encoding apparatus 10 illustrated in FIG. 1.

In FIG. 14, a decoding apparatus 50 includes a demultiplexer 51, a signal decoder 52, a signal inverse-quantizer 53, a multiplier 54, a spectrum inverse-transformation unit 55, an adder 56, a bit allocation information generator 57, a signal normalization information decoder 58, a difference length generator 59, a converter 60, and a header analyzer 61.

The demultiplexer 51 (acquisition unit) of the decoding apparatus 50 performs demultiplexing on the incoming bitstream BS output from the encoding apparatus 10 to acquire the header HD, the exceeding data length $L_{EX}$, the encoding signal normalization information data $C_{SF}$, and the encoding spectrum signal data Cx. The demultiplexer 51 supplies the encoding spectrum signal data Cx to the signal decoder 52 and supplies the exceeding data length $L_{EX}$ to the signal decoder 52 and the adder 56. In addition, the demultiplexer 51 supplies the encoding signal normalization information data $C_{SF}$ to the signal normalization information decoder 58 and supplies the header HD to the header analyzer 61.

The signal decoder 52 determines which of the fixed length decoding process and the variable length decoding process is to be performed on the encoding spectrum signal data Cx supplied from the demultiplexer 51 based on the exceeding data length $L_{EX}$ supplied from the demultiplexer 51.

In addition, in the case where the fixed length decoding process is determined to be performed, the signal decoder 52 (decoder) performs the fixed length decoding process on the encoding spectrum signal data Cx based on the encoding/quantization unit number nqus supplied from the header analyzer 61. The signal decoder 52 supplies the quantization signal qx(f), which is obtained as a result of the fixed length decoding process, to the signal inverse-quantizer 53.

On the other hand, in the case where the variable length decoding process is determined to be performed, the signal decoder 52 performs the variable length decoding process on the encoding spectrum signal data Cx based on the bit allocation information WL(iqu) supplied from the bit allocation information generator 57 and the encoding/quantization unit number nqus. The signal decoder 52 supplies the quantization signal qx(f), which is obtained as a result of the variable length decoding process, to the signal inverse-quantizer 53.

The signal inverse-quantizer 53 (inverse-quantizer) inverse-quantizes the quantization signal qx(f) supplied from the signal decoder 52 based on the bit allocation information WL(iqu) supplied from the bit allocation information generator 57 and the encoding/quantization unit number nqus supplied from the header analyzer 61. The signal inverse-quantizer 53 supplies the normalization spectrum signal nx(f), which is obtained as a result of the inverse-quantization, to the multiplier 54.

The multiplier 54 performs inverse-normalization by multiplying the normalization spectrum signal nx(f) supplied from the signal inverse-quantizer 53 with the $2^{SF(iqu)}$ supplied from the converter 60 to generate the spectrum signal x(f). The multiplier 54 supplies the spectrum signal x(f) to the spectrum inverse-transformation unit 55.

The spectrum inverse-transformation unit 55 performs frequency inverse-transformation on the spectrum signal x(f) supplied from the multiplier 54 to obtain the input signal s(t) which is a time-varying signal. The spectrum inverse-transformation unit 55 outputs the input signal s(t).

The adder 56 adds the exceeding data length $L_{EX}$ supplied from the demultiplexer 51 and the data length $L_{SP}'$ of the spectrum domain supplied from the difference length generator 59, so that the uncompressed spectrum signal data length $L_{USP}$ is obtained. The adder 56 supplies the uncompressed spectrum signal data length $L_{USP}$ to the bit allocation information generator 57.

Similarly to the bit allocation information generator 21 of FIG. 1, the bit allocation information generator 57 (determination unit) generates the bit allocation information WL(iqu) based on the normalization information SF(iqu) supplied from the signal normalization information decoder 58, the encoding/quantization unit number nqus supplied from the header analyzer 61, and the uncompressed spectrum signal data length $L_{USP}$ supplied from the adder 56. In addition, the bit allocation information generator 21 and the bit allocation information generator 57 share the noise masking curve NM(iqu) and the minimum value Low. The bit allocation information generator 21 supplies the bit allocation information WL(iqu) to the signal decoder 52 and the signal inverse-quantizer 53.

The signal normalization information decoder 58 decodes the encoding signal normalization information data $C_{SF}$ supplied from the demultiplexer 51. The signal normalization information decoder 58 supplies the normalization information SF(iqu), which is obtained as a result of the decoding, to the bit allocation information generator 57 and the converter 60. In addition, the signal normalization information decoder 58 supplies the data length $L_{SF}$ of the encoding signal normalization information data $C_{SF}$ corresponding to the encoding/quantization unit number nqus to the difference length generator 59 based on the encoding/quantization unit number nqus supplied from the header analyzer 61.

The difference length generator 59 calculates the data length $L_{SP}$' based on the bitstream length $L_{BS}$, the header length $L_{HD}$, and the data length $L_{WL}$ supplied from the header analyzer 61 and the data length $L_{SF}$ supplied from the signal normalization information decoder 58. More specifically, the difference length generator 59 calculates a value, which is obtained by subtracting the sum of the header length $L_{HD}$, the data length $L_{WL}$, and the data length $L_{SF}$ from the bitstream length $L_{BS}$, as the data length $L_{SP}$'. Next, the difference length generator 59 supplies the data length $L_{SP}$' to the adder 56.

The converter 60 converts the normalization information SF(iqu) supplied from the signal normalization information decoder 58 into $2^{SF(iqu)}$ and supplies the $2^{SF(iqu)}$ to the multiplier 54.

The header analyzer 61 analyzes the header HD supplied from the demultiplexer 51 to obtain the bitstream length $L_{BS}$, the header length $L_{HD}$, the data length $L_{WL}$, and the encoding/quantization unit number nqus. The header analyzer 61 supplies the bitstream length $L_{BS}$, the header length $L_{HD}$, and the data length $L_{WL}$ to the difference length generator 59. In addition, the header analyzer 61 supplies the encoding/quantization unit number nqus to the signal decoder 52, the signal inverse-quantizer 53, the bit allocation information generator 57, and the signal normalization information decoder 58.

[Description of Processes of Decoding Apparatus]

Figure 15:
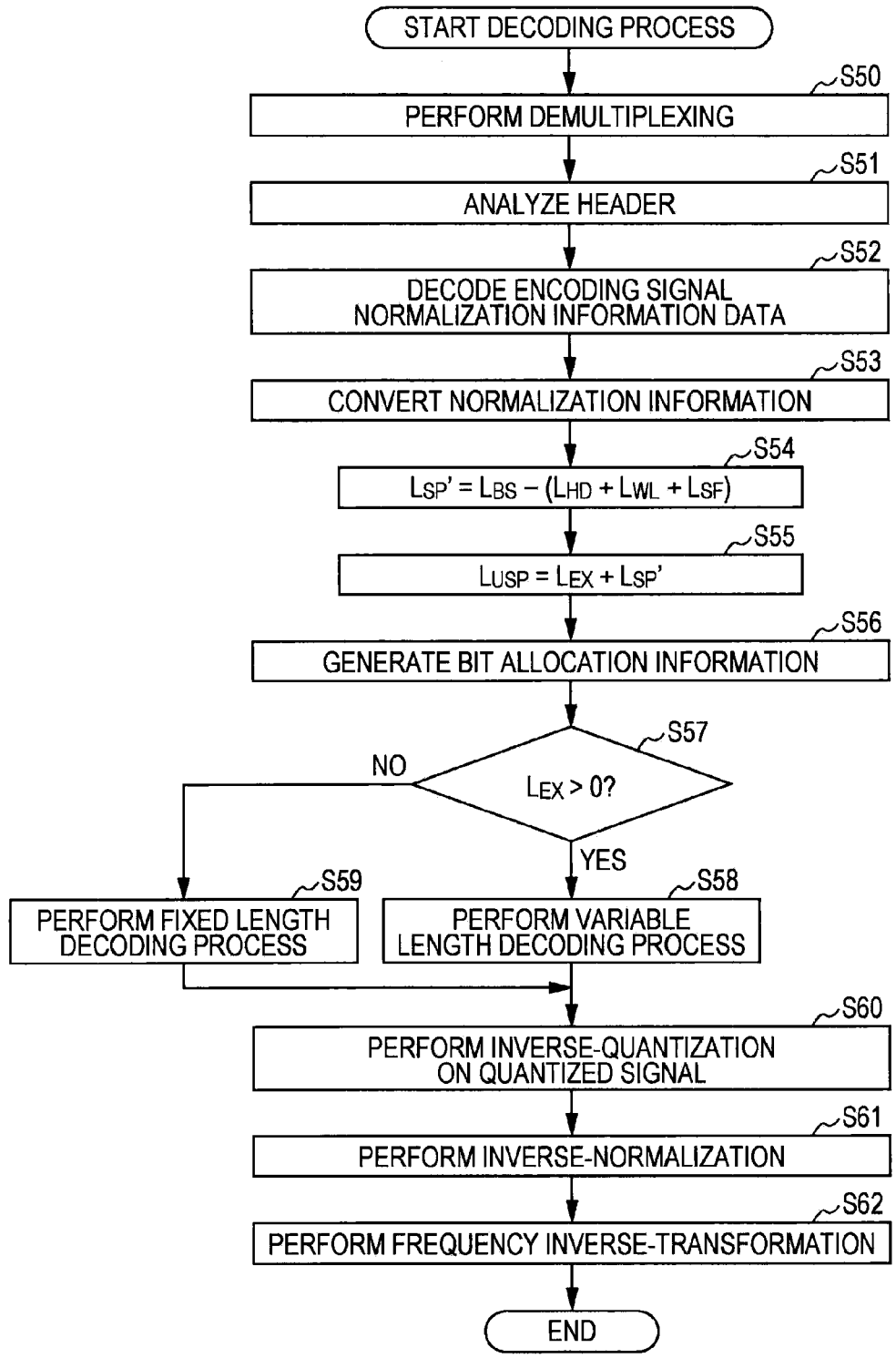
FIG. 15 is a flowchart illustrating a decoding process.

FIG. 15 is a flowchart illustrating a decoding process performed by the decoding apparatus 50 illustrated in FIG. 14. The decoding process starts, for example, when the bitstream BS output from the encoding apparatus 10 illustrated in FIG. 1 is input.

In Step S50, the demultiplexer 51 performs demultiplexing on the incoming bitstream BS output from the encoding apparatus 10 to acquire the header HD, the exceeding data length $L_{EX}$, the encoding signal normalization information data $C_{SF}$, and the encoding spectrum signal data Cx. The demultiplexer 51 supplies the encoding spectrum signal data Cx to the signal decoder 52 and supplies the exceeding data length $L_{EX}$ to the signal decoder 52 and the adder 56. In addition, the demultiplexer 51 supplies the encoding signal normalization information data $C_{SF}$ to the signal normalization information decoder 58 and supplies the header HD to the header analyzer 61.

In Step S51, the header analyzer 61 analyzes the header HD supplied from the demultiplexer 51 to obtain the bitstream length $L_{BS}$, the header length $L_{HD}$, the data length $L_{WL}$, and the encoding/quantization unit number nqus. The header analyzer 61 supplies the bitstream length $L_{BS}$, the header length $L_{HD}$, and the data length $L_{WL}$ to the difference length generator 59. In addition, the header analyzer 61 supplies the encoding/quantization unit number nqus to the signal decoder 52, the signal inverse-quantizer 53, the bit allocation information generator 57, and the signal normalization information decoder 58.

In Step S52, the signal normalization information decoder 58 decodes the encoding signal normalization information data $C_{SF}$ supplied from the demultiplexer 51. The signal normalization information decoder 58 supplies the normalization information SF(iqu), which is obtained as a result of the decoding, to the bit allocation information generator 57 and the converter 60. In addition, the signal normalization information decoder 58 supplies the data length $L_{SF}$ of the encoding signal normalization information data $C_{SF}$ corresponding to the encoding/quantization unit number nqus to the difference length generator 59 based on the encoding/quantization unit number nqus supplied from the header analyzer 61.

In Step S53, the converter 60 converts the normalization information SF(iqu) supplied from the signal normalization information decoder 58 into $2^{SF(iqu)}$ and supplies the $2^{SF(iqu)}$ to the multiplier 54.

In Step S54, the difference length generator 59 calculates the value obtained by subtracting the sum of the header length $L_{HD}$ and the data length $L_{WL}$ supplied from the header analyzer 61 and the data length $L_{SF}$ supplied from the signal normalization information decoder 58 from the bitstream length $L_{BS}$ supplied from the header analyzer 61 as the data length $L_{SP}$'. Next, the difference length generator 59 supplies the data length $L_{SP}$' to the adder 56.

In Step S55, the adder 56 adds the exceeding data length $L_{EX}$ supplied from the demultiplexer 51 and the data length $L_{SP}$' supplied from the difference length generator 59, so that the uncompressed spectrum signal data length $L_{USP}$ is obtained. The adder 56 supplies the uncompressed spectrum signal data length $L_{USP}$ to the bit allocation information generator 57.

In Step S56, similarly to the bit allocation information generator 21 of FIG. 1, the bit allocation information generator 57 generates the bit allocation information WL(iqu) based on the normalization information SF(iqu) supplied from the signal normalization information decoder 58, the encoding/quantization unit number nqus supplied from the header analyzer 61, and the uncompressed spectrum signal data length $L_{USP}$ supplied from the adder 56. Next, the bit allocation information generator 21 supplies the bit allocation information WL(iqu) to the signal decoder 52 and the signal inverse-quantizer 53.

In Step S57, the signal decoder 52 determines whether or not the exceeding data length $L_{EX}$ supplied from the demultiplexer 51 is larger than 0. In the case where the exceeding data length $L_{EX}$ is determined to be larger than 0 in Step S57, the process proceeds to Step S58.

In Step S58, the signal decoder 52 performs the variable length decoding process on the encoding spectrum signal data Cx based on the bit allocation information WL(iqu) supplied from the bit allocation information generator 57 and the encoding/quantization unit number nqus supplied from the header analyzer 61. The signal decoder 52 supplies the quantization signal qx(f), which is obtained as a result of the variable length decoding process, to the signal inverse-quantizer 53, and the process proceeds to Step S60.

On the other hand, in the case where the exceeding data length $L_{EX}$ is determined not to be larger than 0 in Step S57, the process proceeds to Step S59. In Step S59, the signal decoder 52 performs the fixed length decoding process on the encoding spectrum signal data Cx based on the encoding/quantization unit number nqus supplied from the header analyzer 61. The signal decoder 52 supplies the quantization signal qx(f), which is obtained as a result of the fixed length decoding process, to the signal inverse-quantizer 53, and the process proceeds to Step S60.

In Step S60, the signal inverse-quantizer 53 inverse-quantizes the quantization signal qx(f) supplied from the signal decoder 52 based on the bit allocation information WL(iqu) supplied from the bit allocation information generator 57 and the encoding/quantization unit number nqus supplied from the header analyzer 61. The signal inverse-quantizer 53 supplies the normalization spectrum signal nx(f), which is obtained as a result of the inverse-quantization, to the multiplier 54.

In Step S61, the multiplier 54 performs inverse-normalization by multiplying the normalization spectrum signal nx(f) supplied from the signal inverse-quantizer 53 with the $2^{SF(iqu)}$ supplied from the converter 60 to generate the spectrum signal x(f). The multiplier 54 supplies the spectrum signal x(f) to the spectrum inverse-transformation unit 55.

In Step S62, the spectrum inverse-transformation unit 55 performs frequency inverse-transformation on the spectrum signal x(f) supplied from the multiplier 54 to obtain the input signal s(t) which is a time-varying signal. The spectrum inverse-transformation unit 55 outputs the input signal s(t), and the process is ended.

In addition, in the embodiment, although the exceeding data length $L_{EX}$ is disposed in the bitstream BS, the uncompressed spectrum signal data length $L_{USP}$ may be disposed in the bitstream BS.

In this case, the stream length generator 20 illustrated in FIG. 1 supplies the uncompressed spectrum signal data length $L_{USP}$ as it is to the multiplexer 22. In addition, the decoding apparatus 50 is not provided with the adder 56, and the uncompressed spectrum signal data length $L_{USP}$ is directly supplied from the demultiplexer 51 to the bit allocation information generator 57. In addition, in the case where the exceeding data length $L_{EX}$ is disposed, it is possible to increase the spectrum domain in comparison with the case where the uncompressed spectrum signal data length $L_{USP}$ is disposed.

[Description of Computer According to the Present Disclosure]

Next, a series of the aforementioned processes may be performed in a hardware manner or in a software manner. In the case where a series of the processes are performed in a software manner, a program constituting the software is installed in a general-purpose computer or the like.

Figure 16:
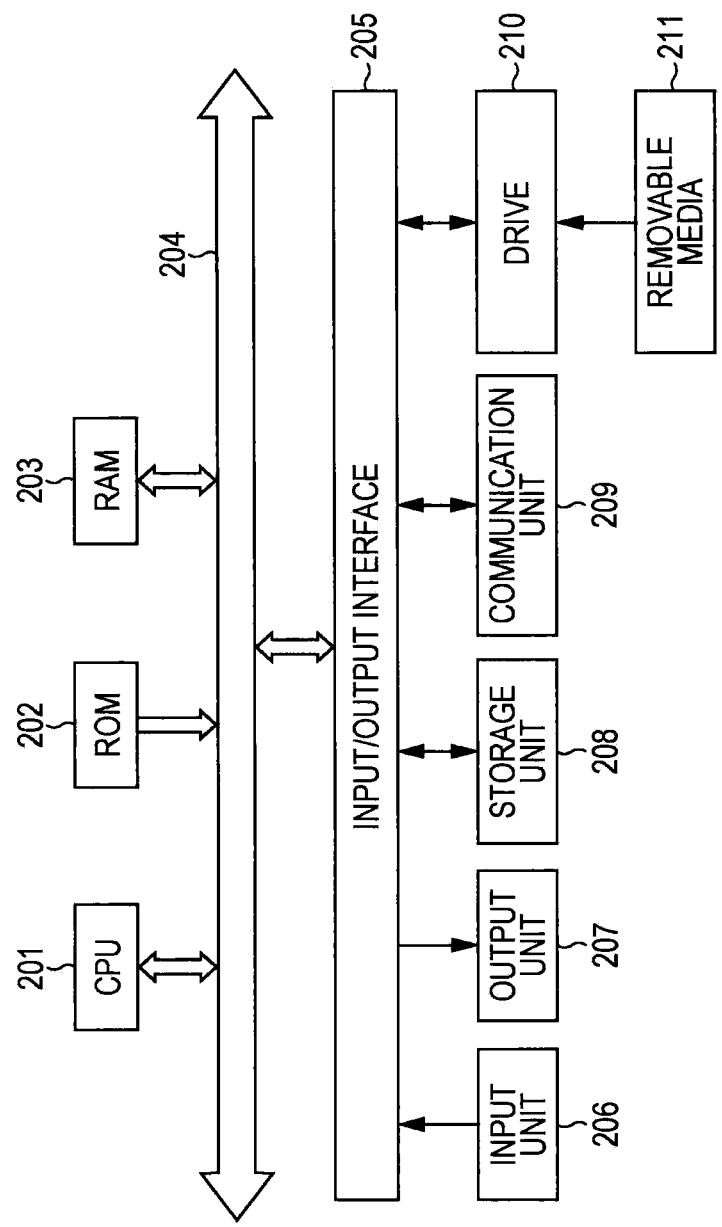
FIG. 16 is a diagram illustrating an example of a configuration of a computer according to an embodiment of the present disclosure.

FIG. 16 illustrates an example of a configuration of a computer according to an embodiment, where a program executing a series of the aforementioned processes is installed.

The program may be recorded in advance in a storage unit 208 or ROM (Read Only Memory) 202 as a recording medium built in the computer.

Alternatively, the program may be stored (recorded) in a removable media 211. The removable media 211 may be provided as so-called package software. Herein, the removable media 211 includes, for example, a flexible disc, a CD-ROM (Compact Disc Read Only Memory), an MO (Magneto Optical) disc, a DVD (Digital Versatile Disc), a magnetic disc, a semiconductor memory, or and the like.

In addition, besides the configuration where the program is installed from the aforementioned removable media 211 through a drive 210 to the computer, the program may be downloaded to the computer through a communication network or a broadcasting network to be installed in the built-in storage unit 208. In other words, the program may be transmitted, for example, from a download site through a satellite for digital satellite broadcasting to the computer in a wireless manner or through a network such as a LAN (Local Area Network) or the Internet to the computer in a wired manner.

The computer includes a CPU (Central Processing Unit) 201, and the CPU 201 is connected via a bus 204 to an input/output interface 205.

If a command is input by a user's manipulation or the like of an input unit 206 through the input/output interface 205, the CPU 201 executes the program stored in the ROM 202 according to the command. Alternatively, the CPU 201 loads the program stored in the storage unit 208 on a RAM (Random Access Memory) 203 to execute the program.

Therefore, the CPU 201 performs the processes according to the aforementioned flowcharts or the processes performed by the configurations of the aforementioned block diagrams. Next, if necessary, the CPU 201 allows the results of the processes, for example, to be output from an output unit 207, to be transmitted from a communication unit 209, to be recorded in the storage unit 208, or the like through the input/output interface 205.

In addition, the input unit 206 is configured with a keyboard, a mouse, a microphone, or the like. In addition, the output unit 207 is configured with an LCD (Liquid Crystal Display), a speaker, or the like.

Herein, in the specification, the processes executed by a computer according to a program may not be necessarily performed in a time sequence according to a procedure disclosed in a flowchart. In other words, the processes executed by a computer according to a program also include processes (for example, parallel processes or processes by objects) which are executed in parallel or individually.

In addition, the program may be executed by one computer (processor). Otherwise, the program may be processed in a distributed manner by a plurality of computers. In addition, the program may be transmitted to a remote computer to be executed.

The present disclosure contains subject matter related to that disclosed in Japanese Priority Patent Application JP 2010-157539 filed in the Japan Patent Office on Jul. 12, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An encoding apparatus comprising:
   a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;
   a quantizer which quantizes the data signal based on the bit allocation; and
   an encoder which performs variable length encoding on the quantized data signal; and
   an output unit which outputs the second data length together with the variable-length-encoded data signal and the normalization information,
   wherein the determination unit updates the second data length so that a difference between a data length of the variable-length-encoded data signal and the first data length is within a predetermined range.

2. An encoding apparatus comprising:
   a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;

a quantizer which quantizes the data signal based on the bit allocation; and an encoder which performs variable length encoding on the quantized data signal; and an output unit which outputs a difference between the first data length and the second data length together with the variable-length-encoded data signal and the normalization information, wherein the determination unit updates the second data length so that a difference between a data length of the variable-length-encoded data signal and the first data length is within a predetermined range.

3. An encoding apparatus comprising:

a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;

a quantizer which quantizes the data signal based on the bit allocation; and an encoder which performs variable length encoding on the quantized data signal, wherein the determination unit updates the second data length so that a difference between a data length of the variable-length-encoded data signal and the first data length is within a predetermined range, and wherein in the case where the data length as the result of the fixed length encoding is smaller than the second data length, the determination unit increments the number of bits allocated to the data signal within a range of a difference between the data length as the result of the fixed length encoding and the second data length.

4. An encoding apparatus comprising:

a determination unit which determines bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;

a quantizer which quantizes the data signal based on the bit allocation; and an encoder which performs variable length encoding on the quantized data signal, wherein the determination unit updates the second data length so that a difference between a data length of the variable-length-encoded data signal and the first data length is within a predetermined range, and wherein in the case where the data length as the result of the fixed length encoding is equal to the first data length, the encoder performs the fixed length encoding on the data signal, and in the case where the data length as the result of the fixed length encoding is larger than the first data length, the encoder performs the variable length encoding on the data signal.

5. An encoding method performed by an encoding apparatus, comprising:

determining bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;

quantizing the data signal based on the bit allocation;

performing variable length encoding on the quantized data signal;

updating the second data length so that a difference between a data length of the variable-length-encoded data signal and the first data length is within a predetermined range; and outputting the second data length together with the variable-length-encoded data signal and the normalization information.

6. A non-transitory, computer-readable storage medium comprising instructions that instruct a computer to execute processes comprising:

determining bit allocation at the time of quantizing a data signal based on normalization information of the data signal so that a data length as a result of fixed length encoding of the quantized data signal becomes close to a second data length which is equal to or larger than a first data length allocated to a result of variable length encoding of the quantized data signal;

quantizing the data signal based on the bit allocation;

performing variable length encoding on the quantized data signal;

updating the second data length so that a difference between a data length of the variable-length-encoded data signal and the first data length is within a predetermined range; and outputting the second data length together with the variable-length-encoded data signal and the normalization information.

7. A decoding apparatus comprising:

an acquisition unit which acquires a quantized variable-length-encoded data signal, a second data length which is equal to or larger than a first data length allocated to the data signal, and normalization information of the data signal;

a determination unit which determines bit allocation at the time of quantizing the data signal based on the normalization information of the data signal so that a data length as a result of fixed length encoding of the quantized data signal becomes close to the second data length;

a decoder which performs variable length decoding on the quantized variable-length-encoded data signal; and an inverse-quantizer which performs inverse-quantization on the quantized data signal, which is obtained as a result of the variable length decoding by the decoder, based on the bit allocation, wherein the acquisition unit acquires a difference between the first data length and the second data length and the normalization information together with the quantized variable-length-encoded data signal and adds the difference and the first data length so as to obtain the second data length.

8. A decoding apparatus comprising:

an acquisition unit which acquires a quantized variable-length-encoded data signal, a second data length which is equal to or larger than a first data length allocated to the data signal, and normalization information of the data signal;

a determination unit which determines bit allocation at the time of quantizing the data signal based on the normalization information of the data signal so that a data length as a result of fixed length encoding of the quantized data signal becomes close to the second data length;

a decoder which performs variable length decoding on the quantized variable-length-encoded data signal; and an inverse-quantizer which performs inverse-quantization on the quantized data signal, which is obtained as a result of the variable length decoding by the decoder, based on the bit allocation, wherein in the case where the data length as the result of the fixed length encoding is smaller than the second data length, the determination unit increments the number of bits allocated to the data signal within a range of a difference between the data length as the result of the fixed length encoding and the second data length.

9. A decoding apparatus comprising:

an acquisition unit which acquires a quantized variable-length-encoded data signal, a second data length which is equal to or larger than a first data length allocated to the data signal, and normalization information of the data signal;

a determination unit which determines bit allocation at the time of quantizing the data signal based on the normalization information of the data signal so that a data length as a result of fixed length encoding of the quantized data signal becomes close to the second data length;

a decoder which performs variable length decoding on the quantized variable-length-encoded data signal; and an inverse-quantizer which performs inverse-quantization on the quantized data signal, which is obtained as a result of the variable length decoding by the decoder, based on the bit allocation, wherein in the case where the data length as the result of the fixed length encoding is equal to the first data length, the decoder performs the fixed length decoding on the data signal, and in the case where the data length as the result of the fixed length encoding is larger than the first data length, the decoder performs the variable length decoding on the data signal.

10. A decoding method performed by a decoding apparatus, comprising:

acquiring a quantized variable-length-encoded data signal, a second data length which is equal to or larger than a first data length allocated to the data signal, and normalization information of the data signal;

determining bit allocation at the time of quantizing the data signal based on the normalization information of the data signal so that a data length as a result of fixed length encoding of the quantized data signal becomes close to the second data length;

performing variable length decoding on the quantized variable-length-encoded data signal;

performing inverse-quantization on the quantized data signal, which is obtained as a result of the variable length decoding by the decoder, based on the bit allocation; and outputting a difference between the first data length and the second data length together with the variable-length-encoded data signal and the normalization information.

11. A non-transitory, computer-readable storage medium comprising instructions that instruct a computer to execute processes comprising:

acquiring a quantized variable-length-encoded data signal, a second data length which is equal to or larger than a first data length allocated to the data signal, and normalization information of the data signal;

determining bit allocation at the time of quantizing the data signal based on the normalization information of the data signal so that a data length as a result of fixed length encoding of the quantized data signal becomes close to the second data length;

performing variable length decoding on the quantized variable-length-encoded data signal;

performing inverse-quantization on the quantized data signal, which is obtained as a result of the variable length decoding by the decoder, based on the bit allocation; and outputting a difference between the first data length and the second data length together with the variable-length-encoded data signal and the normalization information.

* * * * *